United States Patent [19]
Aoki et al.

[11] Patent Number: 4,903,114
[45] Date of Patent: Feb. 20, 1990

[54] RESIN-MOLDED SEMICONDUCTOR

[75] Inventors: Tsuyoshi Aoki; Michio Ono; Kazuhiro Maeda, all of Kawasaki; Hiroyuki Kitasako, Sendai, all of Japan

[73] Assignee: Fujitsu Limited, Kawasaki, Japan

[21] Appl. No.: 207,929

[22] Filed: Jun. 15, 1988

Related U.S. Application Data

[63] Continuation-in-part of Ser. No. 912,095, Sep. 29, 1986.

[30] Foreign Application Priority Data

Oct. 1, 1985 [JP] Japan .................... 60-219624

[51] Int. Cl.$^4$ .............. H01L 23/48; H01L 29/44; H01L 29/52; H01L 29/60
[52] U.S. Cl. .......................... 357/70; 357/74; 357/75
[58] Field of Search ............ 357/70, 74, 75, 71

[56] References Cited

U.S. PATENT DOCUMENTS 4,208,698 6/1980 Narasimhan .................. 357/70

FOREIGN PATENT DOCUMENTS

| 0002079 | 1/1978 | Japan | 357/70 |
| 0001195 | 1/1980 | Japan | 357/70 |
| 58-210650 | 12/1983 | Japan | 357/74 |
| 58-220434 | 12/1983 | Japan | 357/70 |
| 60-79751 | 5/1985 | Japan | 357/74 |
| 0060250 | 3/1987 | Japan | 357/74 |

Primary Examiner—Rolf Hille
Assistant Examiner—Hoanganh Le
Attorney, Agent, or Firm—Staas & Halsey

[57] ABSTRACT

A resin-molded semiconductor device applying an insulation plate unit mounted on a metal die-stage of a metal lead-frame. On the insulating plate unit, an integrated circuit semiconductor chips or a plurality of integrated circuit semiconductor chips are mounted and a plurality of relay-pads for relaying wire bonding connection between the semiconductor chip or chips and inner leads of the lead-frame are formed and arranged so as to correspond to the inner-leads, for electrically insulating the semiconductor chip or chips and the relay-pads from the metal die-stage.

12 Claims, 4 Drawing Sheets

RESIN-MOLDED SEMICONDUCTOR

This is a continuation of co-pending application Ser. No. 912,095 filed on Sept. 29, 1986.

BACKGROUND OF THE INVENTION

The present invention relates to a semiconductor device molding a single or a plurality of integrated circuit chips with resin material.

In general, a resin-molded semiconductor device mounts an IC chip on a lead-frame made of a thin metal plate and molds such a chip with resin material using a transfer mold apparatus in applicability to mass production and low cost of semiconductor device. However, recent increase in packing density of IC chip and also brings about a problem of short-circuit of wires because an IC chip becomes smaller in size with the space between adjacent wires narrowed.

Wires are bonded from connecting pads, which are called as "chip-pads" hereinafter, of the IC chip to inner-leads which are parts, molded in resin, of the lead-frame. A problem of the short-circuiting can be solved by making short the bonded wires. Lengths of the bonded wires can be shortened to a certain degree by narrowing a distance between each chip-pad and a tip part of the inner-lead corresponding to the chip-pad, however, there is a limitation in such attempt, because a lead-frame is formed by etching or stamping technique and the space between the tip parts of the inner-leads cannot be narrowed as desired due to the relation to the required thickness, for example 0.15 millimeter (mm), of the lead-frame. Therefore, the distance between the chip-pad and the tip part of the inner-lead cannot be shortened excessively. Accordingly, shortening of wires was required and has been realized by providing relay-pads on the way from the chip-pads to the tip parts of corresponding inner-leads. A provisional publication in Japan SHO 56-100436 has disclosed about the relay-pads. According to the provisional publication, a conventional long wire 106 shown in FIG. 1 is divided into wires 206 and 306 by a relay-pad 107 as illustrated in FIGS. 2 and 3, which realizes substantially shortening the bonded wires.

Through FIGS. 1, 2 and 3, the same reference numerals designate the same parts. FIGS. 1 and 2 are schematic perspective views illustrating the lead-frame on which an IC chip is mounted. The IC chip 104 is mounted on a die-stage 102 which is a part of the lead-frame 103. In FIG. 1, the wire 106 is bonded between the chip-pad 105 on the IC chip 104 and the tip part of inner-lead 101 which is a part of the lead-frame 103. From FIG. 1, it will be clear that the wire 106 is so long that the trouble of the short-circuiting will occur. In FIG. 2, a plurality of relay-pads 107 are arranged surrounding the IC chip 104 on the die-stage 102 in order to avoid short-circuiting of the bonded wires. Accordingly, the wire 106 shown in FIG. 1 can be divided into the short wires 206 and 306 by the relay-pad 107. That is, because of providing the relay-pad 107, the length of wire can be shortened to a half or less of the length of usual wire such as the wire 106 in FIG. 1, so that the fear of short-circuiting can be eliminated. FIG. 3 is a partially schematic sectional views illustrating how the wires 206 and 306 are bonded. As shown in FIG. 3, the relay-pad 107 comprises an insulator 108 and a metal part 109. Namely, since a die-stage 102 is made of a metal material, the metal part 109 to which the wires 206 and 306 are bonded are provided on the die-stage 102 inserting the insulator 108. The relay-pad 107 is formed by partially coating insulation material onto the necessary places on the surface of the die-stage 102 for forming the insulator 108, depositing a metal on the coated insulator 108, and moreover partially etching the deposited metal in a form of the pad.

As described above, the bonded wires can be shortened by providing the relay-pads to the die-stage and a problem of short-circuit of the bonded wires is solved; however, there is another problem relating to the formation of the relay-pads on the die-stage. Since the lead-frame is made of thin metal plate, the lead-frame is easily deformed or damaged by mechanical force or heat added during the process of forming the relay-pads on the die-stage of lead-frame, resulting in lowering a yield rate of the semiconductor device. FIGS. 1, 2 and 3 illustrate the case where only one IC chip is mounted; however, when a plurality of IC chips are mounted, this problem becomes further distinctive because relay wires or relay electrodes connecting between IC chips may be newly required in addition to the relay-pads.

SUMMARY OF THE INVENTION

An object of the present invention is to avoid deforming or damaging the lead-frame in a fabricating process of forming the relay-pads onto the die-stage of the lead-frame, for preventing the short-circuit problem of the bonded wires in the resin-molded semiconductor device.

Unlike the prior art where an IC chip and relay-pads are directly and individually mounted on a die-stage, the foregoing object of the present invention can be attained by providing an insulating plate unit comprising a single or a plurality of IC chips and relay-pads for mounting the insulating plate unit onto the die-stage and bonding wires from the relay-pads to the inner-leads of the lead-frame.

DESCRIPTION OF THE PREFERRED EMBODIMENTS

Figure 1:
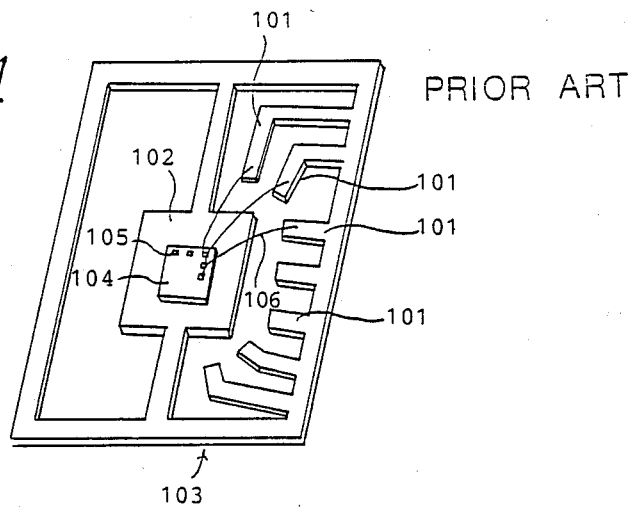
FIG. 1 is a schematic perspective views illustrating the prior art where an IC chip is mounted on the lead-frame and the bonding wires are directly bonded to inner-leads from the chip.
Figure 2:
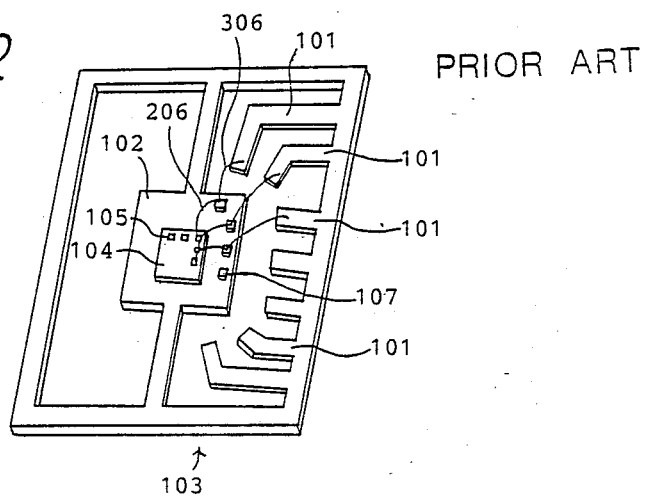
FIG. 2 is a schematic perspective view illustrating the prior art where an IC chip is mounted on the lead-frame and the bonding wires are bonded to the inner-leads from the chip through the relay-pads.
Figure 3:
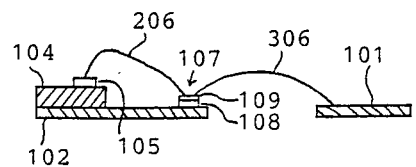
FIG. 3 is a partially sectional view illustrating the prior art where the bonding wire between the chip-pad and the inner-lead is bonded through the relay-pad.
Figure 4:
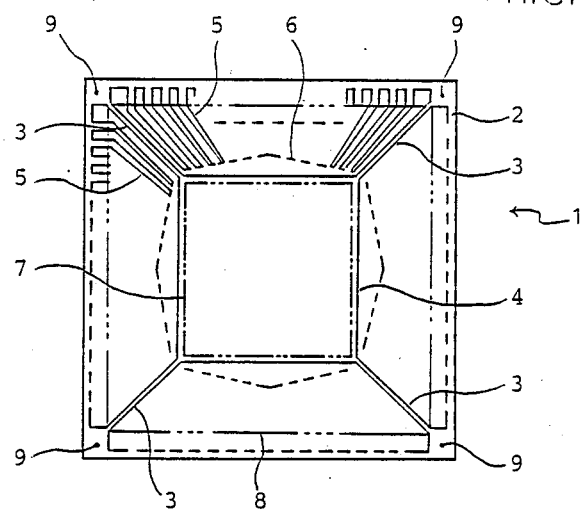
FIG. 4 is a schematic plan view of the lead-frame, which is also applied to the present invention, of the prior art.
Figure 5:
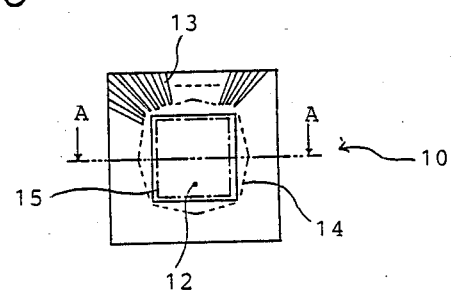
FIG. 5 is a schematic plan view of an insulation plate unit of an embodiment of the present invention wherein only a single IC chip is mounted.
Figure 6:
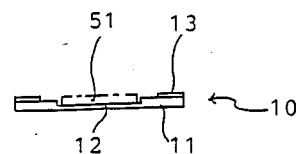
FIG. 6 is a schematic partially sectional view of the insulation plate unit of the embodiment of the present invention wherein a single IC chip is mounted.

FIG. 4 illustrates an example of a lead-frame of the prior art, while FIGS. 5 and 6 illustrate an insulation plate unit which is an embodiment of the present invention wherein a single IC chip is mounted. In FIGS. 4, 5 and 6, like reference numerals designate like parts. FIG. 4 is a schematic plan view of a lead-frame 1 illustrating the inter-relation between a die-stage and inner-leads. The lead-frame 1 shown in FIG. 4 is formed by etching technique, for example, from a metal sheet made of iron-nickel alloy having a thickness of 0.15 mm and comprises a die-stage 4, which is called a first die-stage 4 hereinafter, supported by four support bars 3 extending from four corners 9 of a square outer frame 2 and a plurality of inner-leads 5, each having a belt-shape, extruded to the inside of the lead-frame 1 from the outer frame 2. The tip parts of inner-leads 5 are formed in such a manner as being apart from each side of the first die-stage 4 while the inner-lead 5 goes in opposite to the center of the side as shown by a dotted line 6. This is intended to obtain high speed bonding operation of the bonding apparatus by making equal the lengths of all wires bonded from relay-pads on an insulation plate unit to the tip parts of the inner-leads 5. The insulation plate unit and the relay-pads will be discussed later; however, the insulation plate unit will be mounted on a place surrounded by a two-dot chained line 7 depicted on the die-stage 4 as shown in FIG. 4. The lead-frame 1 is molded with the IC chip in the range surrounded by a square three-dot chained line 8 by the transfer mold apparatus after the insulation plate unit is mounted on the die-stage 4 and the wire bonding is performed. After molding, the outer frame 2 and the four corners 9 are cut away, so that outer-leads remain at the external side of a molded resin. The outer-leads are bent in order to make possible the mounting onto, for example, a printed circuit board, thus completing a resin molded semiconductor device.

Figure 7:
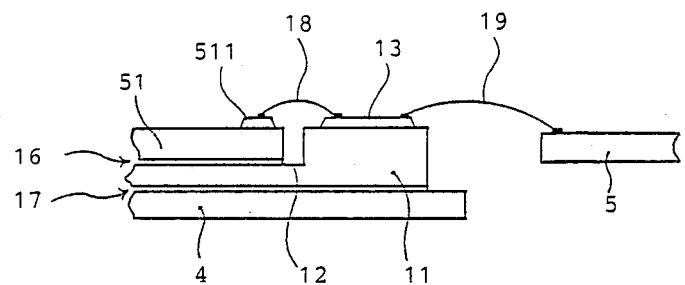
FIG. 7 is a schematic sectional view illustrating the bonding utilizing a relay-pad of the embodiment of the present invention wherein a single IC chip is mounted.

FIG. 5 is a schematic plan view illustrating an insulation plate unit 10 firstly embodying the present invention where a single IC chip is mounted. FIG. 6 is a schematic sectional view of the insulation plate unit 10 at a symbol A—A in FIG. 5. The insulation plate unit 10 comprises a square insulation plate 11 as shown in FIG. 6, and a plurality of relay-pads 13 are provided on the upper surface of the insulation plate 11 and near the outer edge thereof as shown in FIGS. 5 and 6. The insulation plate 11 is made of a thin insulation material such as glass epoxy-resin having a thickness of 0.3 mm. A square area designated by a reference numeral 12 is for mounting an IC chip 51; actually the IC chip 51 is mounted on an area surrounded by a square one-dot chained line 15. The square area 12 will be called a second die-stage 12 hereinafter. The second die-stage 12 is provided by hollowing the upper surface of the insulation plate 11 at the center thereof and the relay-pads 13 are located in the periphery of the second die-stage 12. In case of the embodiment of FIG. 5, the relay-pads 13 have a belt-shaped pattern. A pattern of the relay-pads 13 is not limited only to the belt-shaped one. A pattern of the relay-pads is determined by considering how the chip-pads on the IC chip 51 and the inner-leads 5 of the lead-frame 1 are arranged. As illustrated by a dotted line 14 in FIG. 5, the length of the relay-pads 13 becomes shorter as they become opposite to the center of each side of the second die-stage 12, which is also for equalizing the lengths of the wires to be bonded from the chip-pads and and the relay-pads 13 for obtaining high speed of bonding, which is similar to the case of the inner-leads 5 in FIG. 4. The relay-pads 13 are formed by depositing, for example, copper having a thickness of, for example, 0.35 mm on the upper surface of the insulation plate 11, etching them into a predetermined pattern, and plating them with, for example, gold. FIG. 7 is a schematic partially sectional view illustrating the bonded wires when the bonding is performed from the insulation plate unit 10 to the lead-frame 1. In FIG. 7, the same reference numerals as those in FIGS. 4, 5 and 6 designate the same parts. Reference numerals 16 and 17 indicate a bonding agent for mounting the IC chip 51 and the insulation plate 11 on the second die-stage 12 and on the first die-stage 4 respectively. A hollow depth of the second die-stage 12 is determined so that a bonding face of each chip-pad 511 on the IC chip 51 mounted on the second die-stage 12 has almost the same height as the height of a bonding face of each relay-pad 13 measured from the bottom face of the insulation plate 11, which is for facilitating the bonding operation by the bonding apparatus. As the bonding paste 16 and 17, silver paste, for example, is used.

Figure 8:
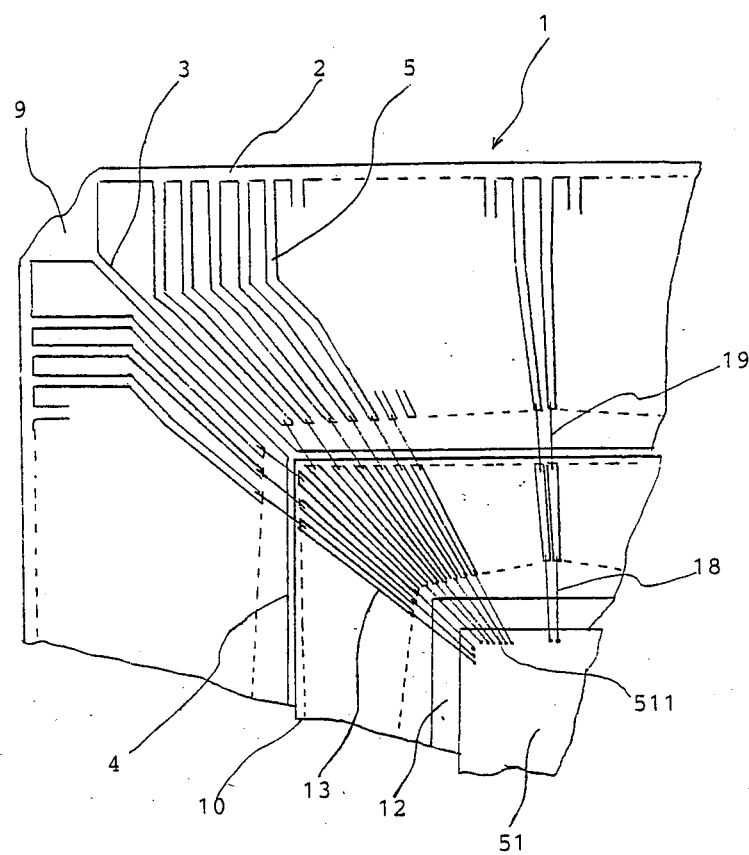
FIG. 8 is a schematic partially enlarged plan view of the lead-frame 1 on which the insulation plate unit for the first embodiment of the present invention is mounted with a single IC chip.

After mounting the IC chip 51 on the second die-stage 12, the chip-pads 511 and the relay-pads 13 are bonded with wires 18 as shown in FIG. 7. FIG. 8 is a schematic partially enlarged plan view of the lead-frame 1 on which the insulation plate unit 10 is mounted with the IC chip 511. In FIG. 8, the same reference numeral as that in FIGS. 4, 5, 6 and 7 designates the same part as that in FIGS. 4, 5, 6 and 7. In the first embodiment shown in FIG. 5, the wire bonding can be performed similarly to the wire bonding stated in FIG. 4 using the same bonding apparatus. In FIGS. 7 and 8, the IC chip 51 is mounted on the second die-stage 12 of the insulation plate 11; the wires 18 are bonded from the chip-pads 511 to the relay-leads 13 so that the insulation plate unit 10 is prepared to be mounted on the first die-stage 4; the insulation plate unit 10 is mounted on the first die-stage 4 of the lead-frame 1; and the wires 19 are bonded from the relay-pads 13 to the inner-leads 5. Thus, the wires 18 usually can be bonded independently to the bonding of the wires 19; however, the wires 18 and 19 also can be bonded at the same time after mounting the insulation plate unit 10 on the first die-stage 4 of the lead-frame 1. Thereby, the lengths of the bonded wires 18 and 19 can be shortened. The wires 18 can be bonded in almost horizontally by the hollow structure of the second die-stage 12. Similarly to above, the wires 19 can also be bonded almost horizontally by depressed structure of the first die-stage 4, and thereby the bonding can be facilitated.

Figure 9:
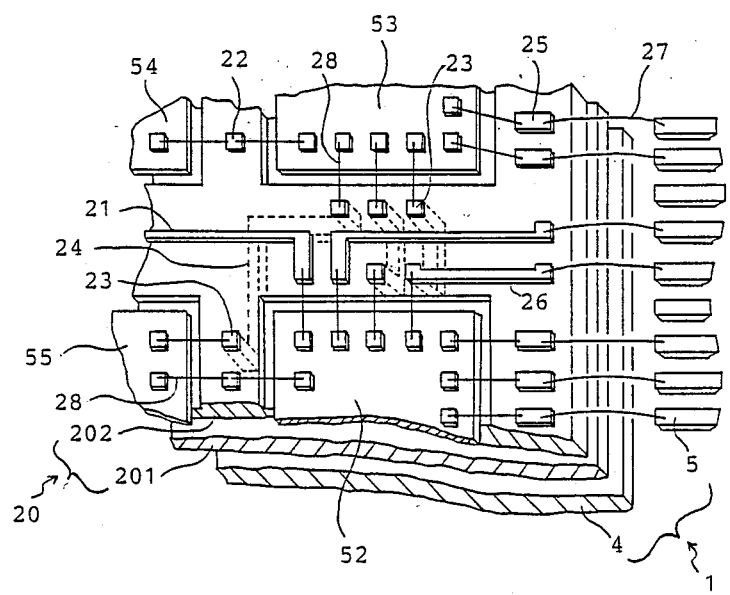
FIG. 9 is a schematic partially perspective view of the insulation plate unit of a second embodiment of the present invention wherein a plurality of IC chips are mounted.

FIG. 9 is a schematic partially perspective view illustrating another second embodiment of the present invention wherein a plurality of IC chips are molded in the semiconductor device. In FIG. 9, the same reference numerals as those in FIGS. 4 and 7 designate the same parts. A plurality of IC chips 52, 53, 54 and 55 are mounted on a printed circuit board 202 mounted on an insulation plate 201, and these are combined into an insulation plate unit 20. On the upper surface of the printed circuit board 202, the IC chips 52, 53, 54 and 55 are mounted and printed circuits such as jumper wirings 21, relay electrodes 22, and relay electrodes 23 which have through-holes, are provided. Moreover, on the rear side of the printed circuit board 202, there are printed circuits such as jumper wirings 24 connected to the through-holes. Even though the first die-stage 4 is made of metal, thus, the through-holes and the rear side circuits can be provided because of providing the insulation plate 201 to the insulation plate unit 20. The insulation plate unit 20 is mounted on the first die-stage 4 of the lead-frame 1 and wires 27 are bonded from the relay-pads 25 and pads 26, which are extended from the jumper wirings 21, to the tip parts of the inner-leads 5 of the lead-frame 1. The relay-pads 25 and pads 26 are provided on the upper surface of the printed circuit board 202 near by the outer edge thereof. The IC chips 52, 53, 54 and 55 are respectively mounted in a hollow structure area at the upper surface of the printed circuit board 202 so that the wires 28 can be bonded easily. It is also possible to further stack such printed circuit boards. When semiconductor devices are manufactured in a small quantity, combining a plurality of ordinary IC chips as described above is far economical compared with newly designing an IC chip and fabricating the IC chips through many steps of masking processes using many kinds of masks newly provided.

As stated above, the insulation plate unit 10 for a single IC chip or the insulation plate unit 20 for a plurality of IC chips can be formed before mounting on the lead-frame. Thereby a problem in mechanical and/or themal deformation or damage of the lead-frame, which has been often seen in the prior art, can be solved.

We claim:

1. A resin-molded semiconductor device comprising:
a metal lead-frame, comprising:
a metal sheet die-stage located in a central portion of the semiconductor device and having an upper surface and a lower surface; and
a plurality of inner-leads, each of said inner leads being a thin metal strip arranged on a plane parallel to and higher than an upper surface of said metal sheet die-stage, extending toward the central portion of the semiconductor device, and placed around said metal sheet die-stage forming a space therebetween;
an insulating plate, mounted on said metal sheet die-stage having a bottom surface attached to the upper surface of said metal sheet die-stage and having an upper surface parallel to the bottom surface, comprising:
a first surface formed at a central portion of said insulating plate;
a second surface formed surrounding said first surface and being at a level, measured from the upper surface of said metal die-stage, higher than that of said first surface, said inner-leads being the same height as said second surface; and
a plurality of relay-wirings provided along the periphery of said second surface, each of said relay wirings corresponding to each of said inner-leads;
an integrated circuit semiconductor (IC) chip having an upper surface and a lower surface parallel to the upper surface, mounted on said first surface of said insulating plate and being the same height as said second surface, including a plurality of chip-pads formed on the upper surface of said integrated circuit semiconductor chip;
a plurality of first bonding wires bonded between said chip-pads and said relay-wirings, respectively, said first bonding wires being short in length since said chip-pads and relay wirings are located a small distance from each other; and
a plurality of second bonding wires bonded between said relay-wirings of said insulating plate and said inner-leads, each of said relay wirings being connected to said respective inner-leads, said metal sheet die-stage, a predetermined portion of said inner-leads, said insulating plate, and said second bonding wires being molded by a resin.

2. A resin-molded semiconductor device according to claim 1, wherein a level, measured from the upper surface of said metal sheet die-stage, of a plane on which said inner-leads are arranged, is determined to be equal to the level of said second surface of said insulating plate.

3. A resin-molded semiconductor device according to claim 1, wherein a difference in height between said first and second surfaces of said insulating plate is equal to a height measured from the bottom surface to the upper surface of said IC chip mounted on said first surface.

4. A resin-molded semiconductor device comprising:
a metal lead-frame comprising:
a metal sheet die-stage located at a central portion of the semiconductor device and having an upper surface and a lower surface; and
a plurality of inner-leads, each being a thin metal strip arranged on a plane parallel to and higher than the upper surface of said metal sheet die-stage, extending toward the central portion of the semiconductive device, and placed around said metal sheet die-stage, forming a space therebetween;
an insulating sheet mounted on said metal sheet die-stage;
a printed wiring board, mounted on said metal sheet die-stage through said insulating sheet, having a bottom surface attached to said insulating sheet and an upper surface parallel to said bottom surface, said upper surface being separated into a plurality of first surfaces and a second surface that surrounds said first surfaces, said first surfaces being formed so that when measured from said bottom surface of said printed wiring board said first surfaces are lower than said second surface, said printed wiring board comprising:
a plurality of relay-wirings formed along the periphery of said second surface, each of said relay-wirings corresponding to said inner-leads;
a plurality of printed circuits placed on said second surface for electrically connecting one of integrated circuit (IC) semiconductor chips mounted on one of said first surfaces with the other of said integrated circuit semiconductor chips mounted on the other ones of said first surfaces;
a plurality of IC chips mounted on said first surfaces respectively, each of said IC chips having a bottom surface and an upper surface, chip-pads being formed on the upper surface of each of said IC chips; and
a plurality of first bonding wires for connecting between said chip-pads and said relay-wirings, respectively; and
a plurality of second bonding wires for connecting between each of said relay-wirings and said inner-leads.

5. A resin-molded semiconductor device according to claim 4, wherein said printed wiring board further comprises a plurality of through holes for connecting said printed circuits to each other and to said relay-wirings.

6. A resin molded semiconductor device according to claim 4, wherein said printed wiring board further comprises a plurality of through holes for connecting said printed circuits to said relay wirings.

7. A resin-molded semiconductor device according to claim 4, wherein a plane on which said inner-leads are arranged is at the same level as said second surface of said printed wiring board.

8. A resin-molded semiconductor device according to claim 4, wherein the difference between a level of one of said first surfaces and a level of said second surface is equal to a height of said IC chips mounted on said first surfaces, said height of each of said IC chips being a height measured from the bottom surface to the upper surface of each of said IC chips.

9. A resin-molded semiconductor device comprising: a metal lead-frame comprising:
   a metal sheet die-stage having an upper surface and a lower surface and located at a central portion of the semiconductor device; and
   a plurality of inner-leads each being a thin metal strip arranged on a plane parallel to and higher than the upper surface of said metal sheet die-stage, extending toward the central portion of the semiconductor device, and placed around said metal sheet die-stage, forming a space therebetween;
   an insulating sheet mounted on said metal sheet die-stage;
   a multi-layered printing wiring board, mounted on said metal sheet die-stage through said insulating sheet, having a bottom surface attached to said insulating sheet and an upper surface parallel to said bottom surface, said upper surface being separated into a plurality of first surfaces and a second surface surrounding said first surfaces, said first surfaces being formed so that the levels of said first surfaces, measured from the upper surface of said metal sheet die-stage, are equal to each other and lower than the level of said second surface, said multi-layered printed wiring board comprising:
   a plurality of relay-wirings formed along the periphery of said second surface, each of said relay-wirings corresponding to one of said inner-leads;
   a plurality of IC chips mounted on said first surfaces respectively, each of said IC chips including chip-pads formed on an upper surface of said IC chips;
   a plurality of printed circuits placed on said second surface for electrically connecting one of said plurality of IC chips mounted on one of said first surfaces with the other ones of said plurality of IC chips mounted on the other ones of said first surfaces; and
   a plurality of first bonding wires for connecting said chip-pads and said relay-wirings, respectively; and
   a plurality of second bonding wires for connecting between said relay-wirings and said inner-leads, respectively.

10. A resin-molded semiconductor device according to claim 9, wherein said multi-layered printed wiring boards further comprise a plurality of through holes for connecting said printed circuits to each other and to said relay wirings, respectively.

11. A resin-molded semiconductor device according to claim 9, wherein said multi-layered printed wiring boards further comprise a plurality of through holes for connecting said printed circuit boards to said relay-wirings.

12. A resin-molded semiconductor device according to claim 9, wherein said first surfaces have levels equal to each other, and levels between said first surfaces and said second surface are equal to a height of said IC chips mounted on said first surfaces, respectively, and a plane on which said inner leads are formed is equal to the height of said second surface measured from the upper surface of said metal sheet die-stage.

* * * * *